(12) United States Patent
Bergmann et al.

(10) Patent No.: US 8,409,972 B2
(45) Date of Patent: Apr. 2, 2013

(54) LIGHT EMITTING DIODE HAVING UNDOPED AND UNINTENTIONALLY DOPED NITRIDE TRANSITION LAYER

(75) Inventors: Michael J. Bergmann, Chapel Hill, NC (US); Daniel C. Driscoll, Raleigh, NC (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 234 days.

(21) Appl. No.: 11/734,218

(22) Filed: Apr. 11, 2007

(65) Prior Publication Data

US 2008/0251800 A1  Oct. 16, 2008

(51) Int. Cl.
*H01L 21/20* (2006.01)

(52) U.S. Cl. .......... 438/478; 438/606; 257/101

(58) Field of Classification Search .......... 438/606, 438/478; 257/101
See application file for complete search history.

(56) References Cited

U.S. PATENT DOCUMENTS

| | | | |
|---|---|---|---|
| 5,210,051 A * | 5/1993 | Carter, Jr. .......... | 438/22 |
| 5,290,393 A | 3/1994 | Nakamura | |
| 5,512,375 A | 4/1996 | Green et al. | |
| 6,051,847 A | 4/2000 | Oku et al. | |
| 6,091,083 A | 7/2000 | Hata et al. | |
| 6,187,606 B1 * | 2/2001 | Edmond et al. .......... | 438/46 |
| 6,388,275 B1 | 5/2002 | Kano | |
| 6,442,184 B1 | 8/2002 | Ota et al. | |
| 6,645,885 B2 * | 11/2003 | Chua et al. .......... | 438/509 |
| 6,649,287 B2 * | 11/2003 | Weeks et al. .......... | 428/698 |
| 6,791,119 B2 | 9/2004 | Slater et al. | |
| 6,853,010 B2 | 2/2005 | Slater, Jr. et al. | |
| 6,861,305 B2 | 3/2005 | Koike et al. | |
| 6,865,203 B2 | 3/2005 | Yoshida et al. | |
| 6,887,726 B2 | 5/2005 | Kimura | |
| 6,906,352 B2 | 6/2005 | Edmond et al. | |
| 6,924,514 B2 | 8/2005 | Suenaga | |
| 7,003,008 B2 | 2/2006 | Yoshida et al. | |
| 7,019,335 B2 | 3/2006 | Suenaga | |
| 7,026,659 B2 | 4/2006 | Slater, Jr. et al. | |
| 7,151,045 B2 * | 12/2006 | Kim et al. .......... | 438/462 |
| 7,193,246 B1 * | 3/2007 | Tanizawa et al. .......... | 257/94 |
| 7,256,483 B2 * | 8/2007 | Epler et al. .......... | 257/676 |
| 2002/0123164 A1 * | 9/2002 | Slater et al. .......... | 438/39 |
| 2004/0051108 A1 * | 3/2004 | Nortrup .......... | 257/82 |
| 2006/0049411 A1 | 3/2006 | Nakamura et al. | |
| 2006/0060877 A1 | 3/2006 | Edmond et al. | |
| 2006/0063287 A1 | 3/2006 | Andrews | |
| 2006/0138937 A1 * | 6/2006 | Ibbetson .......... | 313/502 |

* cited by examiner

*Primary Examiner* — David Vu
*Assistant Examiner* — Caleb Henry
(74) *Attorney, Agent, or Firm* — Myers Bigel Sibley & Sajovec, P.A.

(57) ABSTRACT

A method of forming electronic device precursors and devices with reduced cracking in relevant layers is disclosed along with resulting structures. The method includes the steps of growing a transition layer of undoped Group III nitride on a substrate that is other than a Group III nitride, growing an active structure of Group III nitride on the undoped layer, and removing the substrate from the undoped layer.

14 Claims, 5 Drawing Sheets

LIGHT EMITTING DIODE HAVING UNDOPED AND UNINTENTIONALLY DOPED NITRIDE TRANSITION LAYER

BACKGROUND

The present invention relates to electronic devices in which epitaxial layers of different materials are grown on substrates and in particular relates to Group III nitride layers that are formed, at least initially, on dissimilar substrates such as silicon carbide and sapphire as precursors to devices including, but not limited to, light emitting diodes (LEDs).

The term light emitting diode is used herein in a relatively broad sense to describe those semiconductor devices that produce photons when a current is applied across the device, and typically, although not exclusively, across a p-n junction that is formed by adjacent layers of p-type and n-type materials. The general structure and operation of light emitting diodes is well understood in this art and is described in numerous well-understood and widely available references.

Light emitting diodes have found application in a wide variety of devices and circumstances. Among other applications, they are used for indicator lights, in simple alphanumeric display devices (e.g., calculators), in full color video display screens, as backlighting for other types of displays (e.g., in conjunction with liquid crystal displays) and more recently as illumination sources. As solid-state devices, they share the advantages of light weight, relatively inexpensive cost, small size, generally high reliability and long lifetime.

The Group III nitride compounds have become increasingly of interest in the production of light-emitting diodes and related photonic devices. Group III refers to the third group of the periodic table of the elements and includes (among other elements) gallium (Ga), aluminum (Al), and indium (In). When these elements are formed in binary, ternary, or quaternary compositions, they exhibit desirable semiconductor properties. In particular, the Group III nitrides have relatively large band gaps, which gives them the capacity to emit relatively high energy photons, which in turn means that they can produce photons in the green, blue, violet, and ultraviolet portions of the electromagnetic spectrum. This favorably distinguishes them from materials such as gallium phosphide that have smaller band gaps and that thus emit longer wavelength, lower energy photons in the red and yellow portions of the spectrum.

Blue (and higher-frequency) emitting materials are of particular interest because they can be combined with red-emitting and green-emitting materials to produce white light. Stated more fundamentally, producing white light from LEDs (and in the absence of other materials such as phosphors) requires a combination of blue, red, and green light.

Additionally, the relatively high energy of blue, violet or ultraviolet photons can help stimulate certain phosphors, which in turn produce light in a different, more desired frequency. For example, photons in the blue portion of the visible spectrum can typically excite certain phosphors which emit yellow frequencies. When the frequency of the emitting semi-conductor and the phosphor are properly selected, the combination of blue and yellow light can produce white light.

Additionally, controlling the composition (atomic fractions) of certain Group III nitrides (e.g. InGaN) determines the particular wavelength of the emitted photons. Thus, in a certain sense the Group III nitride compositions can be tuned to produce emissions of desired colors.

As another favorable characteristic, the Group III nitrides are "direct" emitters meaning that all of the energy produced from an electronic transition is emitted as a photon. This is in contrast to other wide band gap materials such as silicon carbide in which the transitions are indirect; i.e., the transition produces some energy in the form of a photon and some energy as vibrations. Accordingly, other factors being equal, direct emitters such as the Group III nitrides produce light more efficiently than do indirect emitters such as silicon carbide.

The wide bandgap advantages of Group III nitrides are not, however, limited to light emission or to devices such as LEDs. Wide bandgap semiconductors have advantages in many types of semiconductor electronic devices including power transistors and high frequency devices such as MESFETs and HEMTs.

To date, however, the growth of bulk crystals of Group III nitrides remains an academic exercise rather than a practical reality. Thus, practical devices that incorporate Group III nitrides for light emitting (or other) purposes typically incorporate epitaxial layers of Group III nitrides on substrates formed of other materials. In the field of light-emitting diodes (as well as some other devices) these substrate materials tend to be either silicon carbide (SiC) or sapphire ($Al_2O_3$).

Sapphire offers the advantage of being mechanically strong and highly transparent. Sapphire cannot, however, be conductively doped. Thus, devices formed on sapphire substrates cannot be arranged in a "vertical" orientation. As known to those familiar with this art, a vertical orientation is one in which the electrical (ohmic) contacts are at axially opposite ends of the device. Vertical devices offer certain engineering and size advantages in comparison to "horizontal" devices in which the ohmic contacts must be arranged in side by side geometry because of the lack of a conductive substrate. Generally speaking, for the same effective device area, the footprint of a vertical device is smaller than the footprint of a horizontal device.

Silicon carbide offers the advantage of being conductive, but is more difficult to make transparent, particularly when doped to obtain the desired conductivity. Nevertheless, because some devices purposely incorporate insulating substrates, both types of substrates (sapphire and silicon carbide) are of theoretical and commercial interest for LEDs and other devices.

As a structural factor, however, the unit cell dimensions of the Group III nitrides differ somewhat from that of silicon carbide or sapphire; e.g., hexagonal GaN is 3.19 Å, hexagonal SiC is 3.08 Å and sapphire is 2.75 Å. Thus, growing Group III nitride layers on silicon carbide or sapphire substrates always includes a lattice mismatch. In turn, this lattice mismatch produces a resulting strain in the Group III nitride layer. Such strain normally falls into two categories, tension and compression. In layman's terms, a layer under tension has been stretched somewhat to match the substrate. A layer under compression has been squeezed to match the substrate. When a thin layer of Group III nitride is placed on one of these substrates, the resulting strain is smaller and less relevant. As the Group III nitride layer becomes thicker, however, the strain normally increases and causes additional problems such as dislocations and cracking.

Accordingly, Group III nitride device structures on SiC or sapphire substrates typically include one or more Group III nitride buffer (i.e., lattice transition) layers between the substrate and the active layers. These transition layers typically have a composition different from the active layers, but with a lattice matched more closely to that of the relevant substrate. As any of these transition layers become thicker, the defects and stress problems generated by the layer-substrate mismatch will tend to increase. As noted above, thinner transition layers can be pseudomorphic; i.e., they are sufficiently elastic to match the substrate with minimal resulting strain. As the layers grow thicker, however, the crystal structure of the epilayer reduces the elasticity and increases the resulting strain.

Thus, from the strain standpoint, thinner transition layers would normally be preferred. In some current device technology, however, the dissimilar substrate (e.g. SiC or sapphire) is eventually removed in order to produce the final structure. In those cases, the transition layer serves at least two purposes: (i) it provides the crystal transition noted above while the substrate is present, and (ii) it provides a structural support for the active layers after the substrate has been removed. When serving as a structural support, a thicker transition layer is sometimes desired or necessary rather than a thinner one. Thicker layers help provide the required support and manufacturing tolerance during the production of the finished device. As another factor, thicker epitaxial layers can help in current spreading.

Historically, in order to produce vertical devices on conductive substrates (e.g., SiC), any such buffer or transition layers were produced to be conductive and thus included dopants. For number of reasons, however, such dopants can increase the resulting strain in a crystal layer.

Accordingly, a need exists for techniques and structures that favorably permit or include thicker transition layers while minimizing the disadvantageous strain that can accompany such thicker layers.

SUMMARY

In one aspect, the invention is a method of forming electronic device precursors and devices with reduced cracking in relevant layers. The method comprises growing a transition layer of undoped Group III nitride on a substrate that is other than a Group III nitride, growing an active structure of Group III nitride on the undoped layer, and removing the substrate from the undoped layer.

In another aspect the invention is a light emitting diode that includes a substrate selected from the group consisting of, for example, silicon carbide and sapphire, a Group III nitride transition layer having a thickness of between about 0.1 and 1.0 microns and a carrier concentration below about 1E17, and at least one p-type Group III nitride layer and at least one n-type Group III nitride layer above the undoped transition structure for generating an emission when current is applied across the p-type and n-type layers.

In another aspect the invention is a light emitting diode that includes a conductive header, at least one p-type layer of Group III nitride and at least one n-type layer of Group III nitride on the conductive header for generating an emission when current is applied across the p-type and n-type layers, and an undoped Group III nitride layer above the p-type and n-type layers, the undoped Group III nitride layer forming at least the emitting surface of said light emitting diode.

In another aspect, the invention is the method of making light emitting diodes (with flip chip orientation) by growing a transition layer of one semiconductor on a substrate of a different semiconductor and then growing Group III nitride epitaxial active layers on the transition layer on the substrate and thereafter removing the substrate from the transition layer, and characterized by growing the transition layer undoped to thereby minimize the resulting strain between the transition layer and the substrate.

The foregoing and other objects and advantages of the invention and the manner in which the same are accomplished will become clearer based on the followed detailed description taken in conjunction with the accompanying drawings.

DETAILED DESCRIPTION

The present invention relates to light emitting diodes and their manner of manufacture. As set forth in the Background certain LEDs are manufactured using Group III nitride active layers on silicon carbide substrates, after which the substrate is removed to produce the desired chip or "die" structure. The invention is particularly useful for such flip chip, substrate-removed devices.

Figure 1:
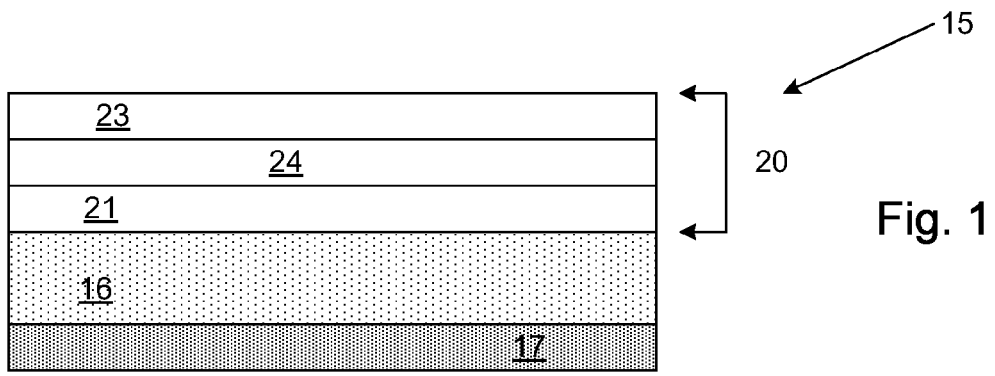
FIG. 1 is a cross-sectional schematic view of a diode structure according to the present invention.

The method and resulting structures of the invention can be understood in connection with the drawings. In that context, FIG. 1 illustrates a structure that in many cases will be intermediate to a final device structure, but in some cases can also represent the final structure. The structure schematically illustrated in FIG. 1 is broadly designated at 15. The structure is formed by growing a transition layer 16 of undoped Group III nitride on a substrate 17 that is other than a Group III nitride, with the most typical (but not exclusive) substrates being selected from the group consisting of silicon carbide and sapphire. Sapphire cannot be conductively doped and thus always forms an insulating substrate. In methods and resulting structures in which the substrate is eventually removed, this offers no disadvantage. Silicon carbide can be either conductively doped or left undoped and thus offers somewhat more flexibility depending upon the final device or structure desired.

As used herein, the term "undoped' includes materials (including intrinsic materials) that include dopant atoms, but that are not intentionally or proactively doped. As well understood in the art, a small amount of unintentional doping typically occurs based upon background contamination in whatever apparatus is used to grow or otherwise form the undoped layer. Such materials are also referred to as "intrinsic." With respect to gallium nitride (GaN) and related Group III nitrides, layers having carrier concentrations of about 1E17 or less ($1 \times 10^{17}$ cm$^{-3}$) are typically considered undoped. As recognized by those familiar with this art, the terms "undoped" and "unintentionally doped" are often used in interchangeable fashion, and they will be understood in that manner in the this specification. Similarly, skilled persons may consider other carrier concentrations to be "undoped." For example, commonly-assigned U.S. Pat. Nos. 5,210,051; 6,791,119; 6,853,010 and 7,026,659 consider concentrations as high as 7E17 to be "undoped."

An undoped gallium nitride (or other Group III nitride) layer can also be characterized by its conductivity or resistivity, with resistivity being used more typically to describe undoped, semi insulating, or insulating structures. When described in this manner, the undoped Group III nitride layer should have a bulk resistivity greater than 0.05 ohm centimeters ($\Omega$-cm), more preferably at least about 0.1 $\Omega$-cm, and potentially as much as 0.2 $\Omega$-cm or more.

According to the invention, it has been discovered that reducing the doping in the transition layer(s) tends to reduce or relieve lattice strain in such undoped layers that are grown on substrates other than Group III nitrides, such as silicon carbide and sapphire. In turn, reducing lattice strain permits all of the Group III nitride layers to be grown thicker than otherwise-equivalent doped layers without increasing cracking or other defects. This provides more structural options during manufacturing and use, including manufacturing and use in which the substrate is later removed. Additionally, reducing the strain on the transition layer correspondingly helps reduce strain on additional epitaxial layers on the transition layer. This permits such epitaxial layers to be thicker (if desired) at less relative and absolute strain.

FIG. 1 further illustrates that the method next includes the steps of growing an active structure designated by the brackets 20 of Group III nitride on the undoped layer 16. As understood by those of skill in this art, the active structure will include at least one n-type layer 21 and one p-type layer 23 of Group III nitride and can potentially include additional layers such as the emission (or "active") layer 24 illustrated in FIG. 1, as may be desired or necessary.

The general structure of Group III nitride based light emitting structures is well understood in this art and will not be otherwise discussed in detail.

It will be further understood that the active structure 20 can include structures that are more complex than are illustrated in FIG. 1, including multiple quantum wells and superlattice structures. The Group III nitride active structures can also include both homojunctions and heterojunctions for the various purposes for which each offers advantages.

The Group III nitride undoped transition layer can be selected from any one of the group of gallium nitride, aluminum gallium nitride, indium gallium nitride, and aluminum indium gallium nitride. These compositions are typically represented in the art by formulas such as $Al_xGa_{1-x}N$, $In_xGa_{1-x}N$, and $Al_xIn_yGa_{1-x-y}N$ where x and y refer to the atomic fraction of the Group III elements in each composition, typically expressed as a decimal fraction. These formulas will be used in their normal convention in this description.

The undoped transition layer 16 is typically grown to a thickness of between about 0.1 and 1.0 microns ($\mu$m), with about 0.3 $\mu$m being presently preferred. In exemplary embodiments, the transition layer 16 is formed of AlInGaN or AlGaN with compositions of about $Al_{0.2}Ga_{0.8}N$ being presently preferred. The carrier concentration is less than 7E17, preferably less than 3E17, and most preferably less than 1E17. In turn, and depending upon desired or necessary growth techniques or final structures, the method can comprise growing a plurality of layers of which at least one (and potentially more than one) is undoped for the purposes described herein. Because the purpose is to reduce strain, however, if this can be accomplished with, for example, a combined structure of two layers, one of which is undoped and one is doped, such a structure falls within the invention and the claims herein.

Figure 2:
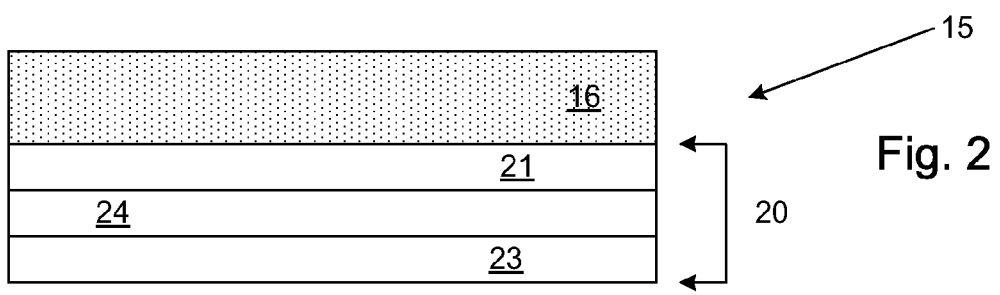
FIG. 2 is another cross-sectional schematic view of a structure according to the present invention and illustrating the chip as flipped with respect to FIG. 1 and with the substrate removed.

In the final step in many embodiments and as illustrated in FIG. 2, the substrate 17 is removed from the thick undoped layer 16 to produce the structure illustrated in FIG. 2. FIG. 2 is flipped around a horizontal axis with respect to FIG. 1, because in some circumstances the final light emitting diode will be mounted in this fashion with the undoped layer 16 forming the primary emitting surface of the final device. In such cases, and as will be described in more detail with respect to FIG. 7, the active structure 20 is mounted on a lead frame (also referred to as a header) and oriented with the undoped Group III nitride layer 16 as the emitting surface. In other circumstances, the undoped layer 16 is also removed and a portion of the active structure 20 becomes the light emitting surface.

It will be understood that although the geometry of the finished diode has a relative orientation, the quantum events that generate photons emit those photons in all directions and thus at least some photons will exit from every surface of the diode (unless they are blocked by a reflector or opaque portion of the diode. Accordingly, the "light emitting face" of a diode is a relative term. In reality the photons travel in all directions, but many are absorbed or internally reflected based on the geometry of the respective layers in the diode and its packaging.

Figure 3:
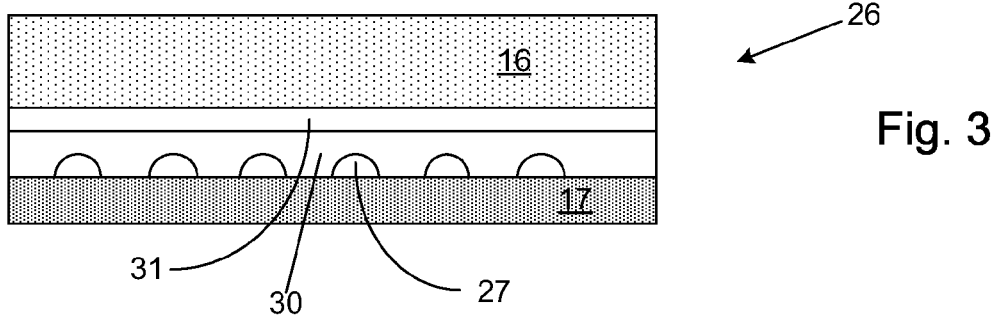
FIG. 3 is a cross sectional schematic diagram of a transition structure according to the present invention.

FIGS. 3 through 6 illustrate another embodiment of the method and the resulting structures. In FIG. 3 the overall structure is broadly designated at 26. Where appropriate, similar elements in FIG. 3 as in FIGS. 1 and 2 will carry similar reference numerals to provide an appropriate comparison between and among the embodiments. Accordingly, FIG. 3 illustrates a substrate 17 which, as in the previous embodiment, can include, but is not limited to, silicon carbide and sapphire.

As one method of growing a favorable transition structure, the method includes the step of growing a discontinuous Group III nitride layer on the substrate 17. FIG. 3 illustrates this discontinuous layer as a plurality of gallium nitride or aluminum gallium nitride dots 27, but the discontinuous layer can also include other structures including those that have been specifically patterned to be discontinuous. Such dots or discontinuous layers are described, for example, in commonly assigned U.S. Pat. No. 6,187,606; the contents of which are incorporated entirely herein by reference. The discontinuous layer 27 provides a partial transition from the silicon carbide (e.g.) substrate 17 to the Group III nitride layers. In the invention, the discontinuous layer 27 can be doped, undoped, or partially doped.

In this embodiment, the method next comprises the step of growing a continuous Group III nitride layer 30 on the discontinuous layer 27. The undoped transition layer 16 is then grown on the continuous Group III nitride layer 30.

As further illustrated in FIG. 3, however, in many embodiments an additional layer 31 of graded Group III nitride material is added between the continuous layer 30 and the undoped layer 16. As used herein, the term graded refers to a layer with a changing composition between its respective surfaces. At the surface that meets the continuous Group III nitride layer 30, the graded layer 31 has a composition most similar to the composition of the continuous layer 30. At the interface with the undoped layer 16, the graded layer 31 has a composition most similar to the composition of the undoped layer 16. The composition of the graded layer 31 changes slightly between these two boundaries. In most cases the change is one of atomic fraction; e.g. the entire layer is $Al_xGa_{1-x}N$ but the value of x changes within the layer.

Figure 4:
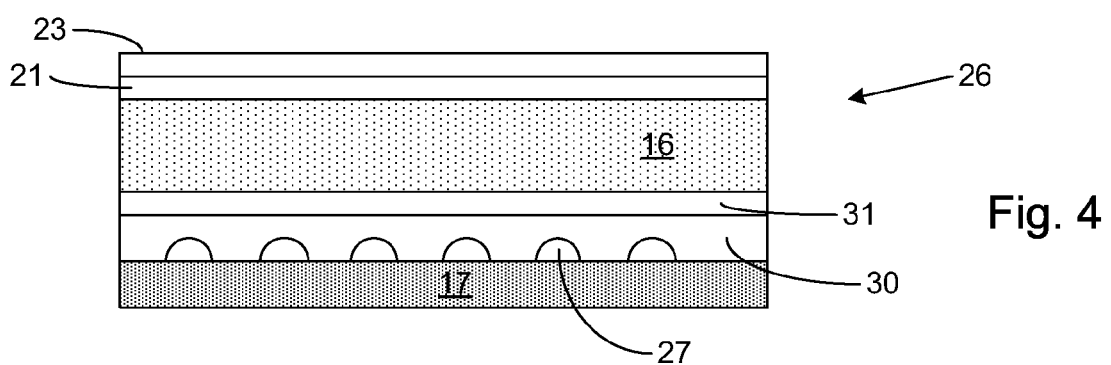
FIG. 4 is a cross-sectional diagram of the transition structure of FIG. 3 with epitaxial layers added.

FIG. 4 illustrates the structure 26 following growth of the respective n-type 21 and p-type 23 layers of Group III nitride.

Figure 5:
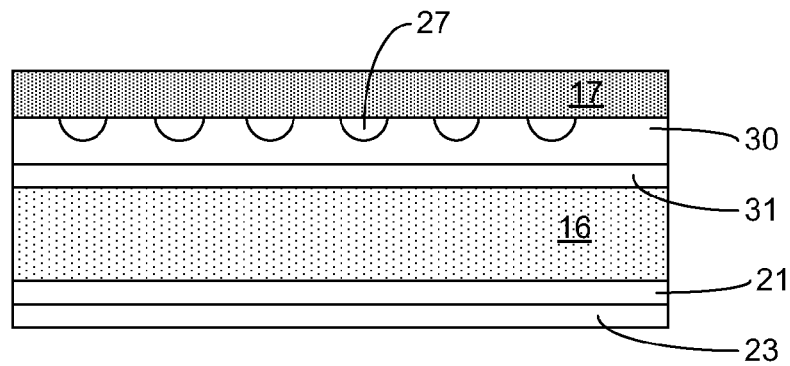
FIG. 5 is a cross-sectional schematic view of the diagram of FIG. 4 but flipped in orientation to illustrate one possible LED structure.
Figure 6:
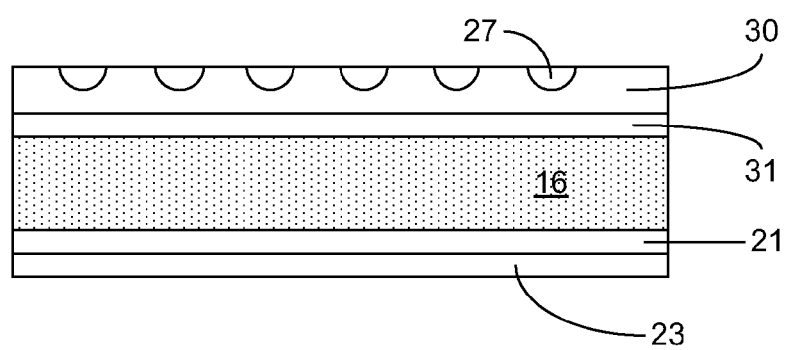
FIG. 6 is a cross-sectional schematic view of the structure of FIG. 5 but with the substrate removed to illustrate another potential LED structure.

FIGS. 5 and 6 illustrate aspects of this embodiment when used in a flip chip orientation. In some cases, the silicon carbide substrate 17 can be maintained as part of the structure and becomes the emitting surface of the resulting light emitting diode. In other embodiments, the silicon carbide substrate 17 and one or more of the other portions can be removed to form a flip chip structure with one of the Group III nitride layers as its emitting face.

In this embodiment, as in the earlier embodiments, minimizing the doping in the undoped layer 16 permits the layer 16 to be grown to a greater thickness while minimizing the extent to which the increased thickness increases the strain on the layer and any strain-related resulting defects or cracking.

The invention can also be understood from the structural standpoint of a light emitting diode (LED). In this context, FIG. 1 illustrates a substrate 17 selected from the group consisting of silicon carbide and sapphire, a Group III nitride transition layer 16 having a thickness of between about 0.1 and 1.0 microns and a carrier concentration below about 1E17, and at least one p-type Group III nitride layer 23 and a least one n-type Group III nitride layer 21 on the undoped transition structure 16 opposite the substrate 17 for generating an emission when current is applied across the p-type 23 and n-type 21 layers. As illustrated in FIGS. 1 and 2, the light emitting diode can further comprise an active layer 24 between the p-type layer 23 and the n-type layer 21.

The undoped Group III nitride transition layer 16 can have a thickness greater than would be otherwise possible at the same defect level with doped material, and also permits the additional layers to be thicker; i.e., the layers on the undoped layer can be grown thicker while retaining crystal quality equivalent to that of thinner layers that are grown without the undoped layer.

A diode structure will also typically include ohmic contacts (shown schematically in FIG. 7) for applying the current across the active layers 21, 23, and 24 to generate an emission from those layers.

As is the case with many light emitting diodes, the chip itself can be mounted on a header (FIG. 7) for physical support and for electrical contact and for supporting a lens that enhances the visible output of the diode.

Figure 7:
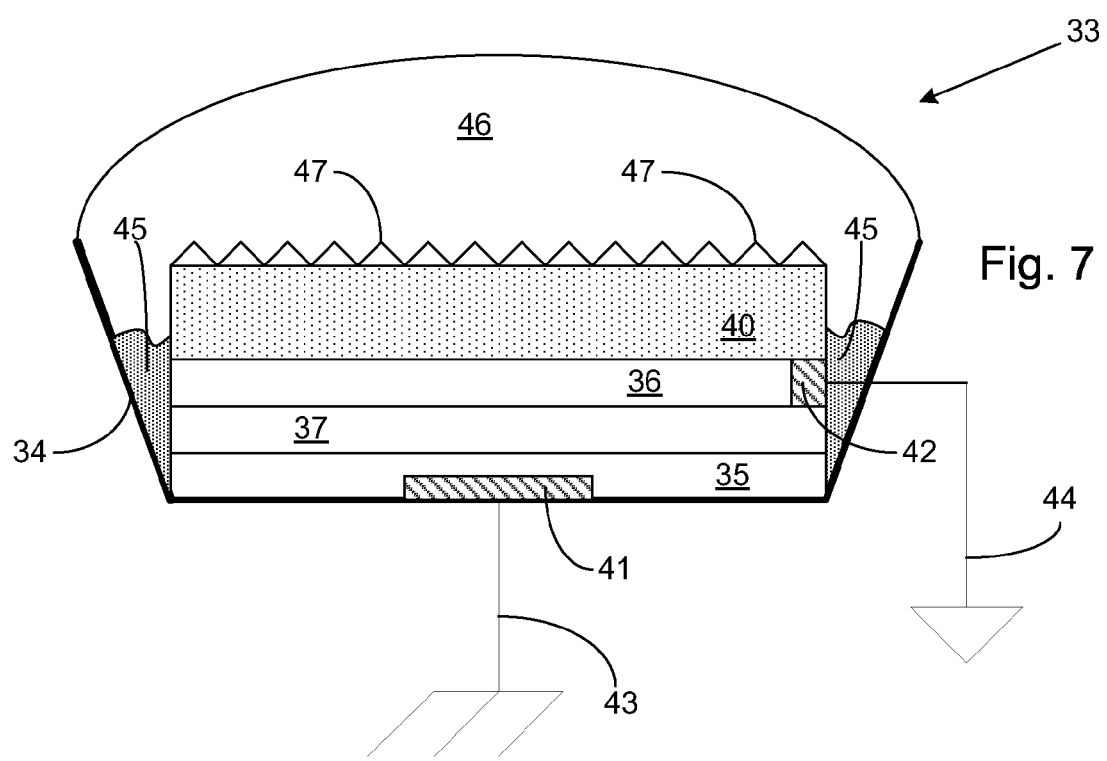
FIG. 7 is a schematic cross-sectional view of a light emitting diode according to the present invention with header and lens.

FIG. 7 illustrates a light emitting diode package structure broadly designated at 33 according to the present invention. The packaged LED 33 includes a conductive header schematically shown by the bold line structure 34 for providing physical support and electrical contact to elements of the LED 33. At least one p-type layer 35 and at least one n-type layer 36 are on the conductive header 34 for generating an emission when current is applied across the p-type and n-type layers 35, 36. FIG. 7 also illustrates an additional active layer 37 (usually, but not exclusively, n-type) for providing the emission under the applied current. As with the earlier embodiments, the p-type layer 35 and the n-type layer 36 illustrate the most basic junction structure for a light emitting diode, and it will be understood that more complex structures such as multiple quantum wells, superlattice structures, or heterojunction structures can be successfully incorporated with the present invention.

The undoped Group III nitride layer is designated at 40 in FIG. 7 and is above the p-type and n-type layers 35, 36, and potentially another active layer 37. The undoped Group III nitride layer 40 forms at least the emitting surface of the LED 33.

The light emitting diode 33 includes respective ohmic contacts 41 to the p-type layer 35 and 42 to the n-type layer 36. FIG. 7 illustrates the contacts 41, 42 schematically and it will be understood that they need not be in the exact geometrical orientation illustrated. The selection of metals that have ohmic characteristics with respect to p-type Group III nitrides and n-type Group III nitrides is well understood in the art and these can be selected without undue experimentation. The ohmic contacts are in turn in contact with the respective leads 43 and 44 or with related elements of a chassis or circuit.

FIG. 7 also illustrates that in many circumstances the semiconductor portion of the light emitting diode 33 is mounted onto the header 34 with a structural adhesive shown as the shaded portions 45. If insulating or otherwise not interfering with the electronic properties of the device, the adhesive 45 can be positioned generally as shown in FIG. 7. If, however, a conductive material (e.g. silver solder) is used, the exact positioning may be other than as illustrated in FIG. 7 in order to avoid undesired electrical shunting or short circuiting between and among the active layers 35, 36, 37, the adhesive 45, and the header 34. These arrangements are however, likewise well understood in the art and need not be explained in further detail herein.

A polymer lens 46 is typically included for one or more purposes including, but not limited to, environmental protection and enhancing the light output pattern. Epoxy and polysiloxane ("silicone") polymers are often used for this purpose and can be used in conjunction with the present invention. Other appropriate polymers can be used provided they do not otherwise interfere with the structure and operation of the diode 33 or unfavorably react with any of the other materials. To the extent possible, the material for the lens 46 should also be as transparent as possible to the emitting wavelength of the active structure. In addition to thus preventing the lens from blocking light output, transparent lens materials will suffer little or no degradation from the emitted photons.

As in the previous embodiments, the undoped Group III nitride layer 40 will have a carrier concentration less than about 7E17 and often between about 1E15 and 1E17. This produces a layer with a resistivity of at least about 0.05 ohm centimeters and potentially 3 ohm centimeters or more.

FIG. 7 also illustrates that the diode can incorporate a shaped (also referred to as "roughened" or "lenticular") surface 47 schematically illustrated as triangles or pyramids. The use of such surfaces for light emitting and extraction purposes, particularly in the context of Group III nitride based light emitting diodes is set forth in commonly assigned issued patents and published applications such as Nos. 6,791,119 and 20060060877, the contents of which are incorporated entirely herein by reference.

FIGS. 8 through 13 are schematic cross-sectional illustrations of additional embodiments of diodes according to the present invention. Where appropriate, previously-described elements carry the same reference numerals as in the earlier figures. In each of FIG. 8-12, the diodes are oriented with their light emitting surface towards the top of the page.

Figure 8:
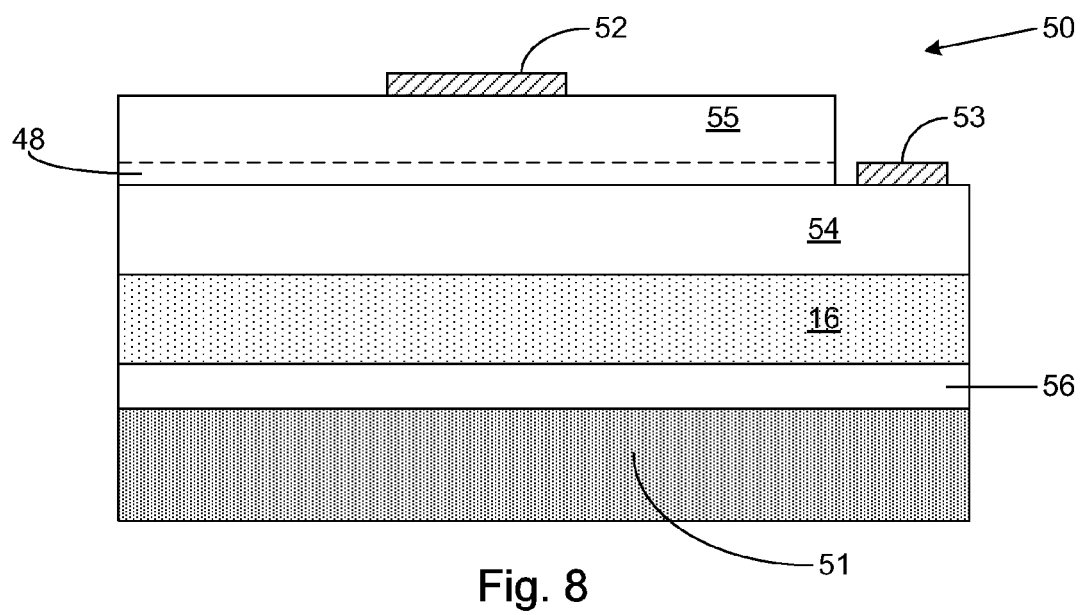
FIGS. 8-13 are schematic cross-sectional diagrams of other embodiments of diodes according to the present invention.

Accordingly, FIG. 8 illustrates a diode 50 that includes the undoped transition layer 16 on a substrate 51 that can be insulating or conductive. Sapphire is, of course, an example of such a non-conductive substrate and silicon carbide is an example of a substrate that can be conductive or nonconductive. Because the substrate 51 is not necessarily conductive, the ohmic contacts 52 and 53 respectively are positioned in a horizontal rather than vertical orientation. As illustrated in FIG. 8, one ohmic contact 53 is made to the face of an n-type layer 54 and another ohmic contact 52 is made to the p-type layer 55. As in the other embodiments, and as indicated by the dotted portion 48, additional active layers can be included as part of the p-n light emitting structure. FIG. 8 includes the potential discontinuous layer (or layers) 56 that can include one or more buffer layers, graded layers, or the discontinuous dots described earlier with respect to the other figures. In FIG. 8, the light emission is substantially through the p-type layer 55.

Figure 9:
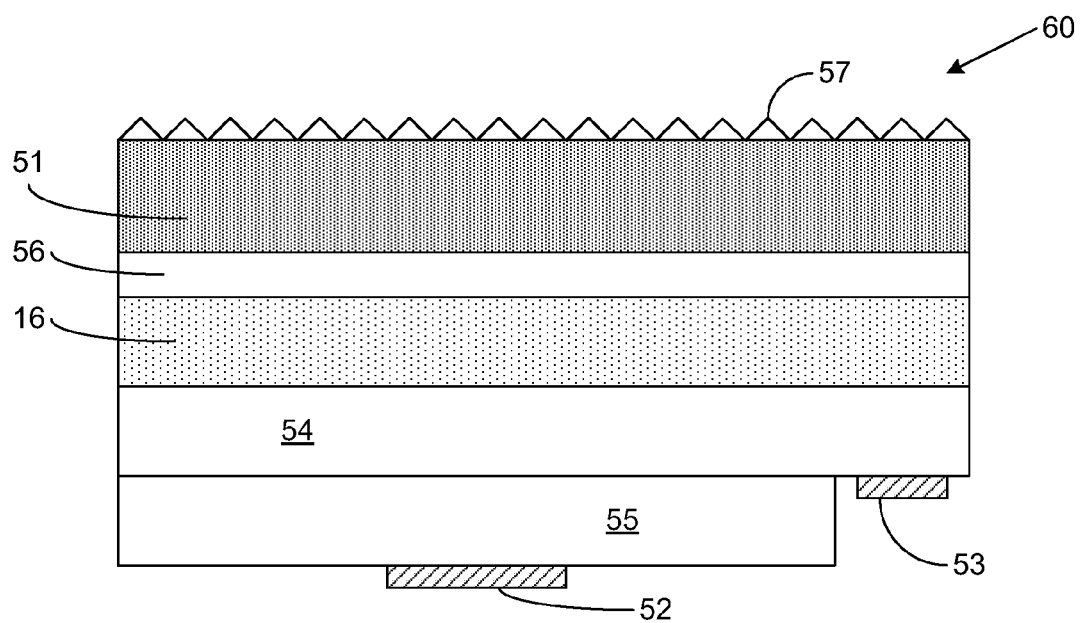

FIG. 9 illustrates a similar diode broadly designated at 60, but in a flip chip orientation. Accordingly, in FIG. 9 the substrate 51 comprises the light emitting surface of the diode with or without the optional lenticular surface 57. In this orientation, the discontinuous layer 56 (if present) is positioned immediately adjacent to the substrate 51 while the p-type layer 55 forms the bottom of the device adjacent the n-type layer 54. The undoped transition layer is again designated at 16 and the ohmic contacts are designated at 52 and 53 respectively. Thus, in FIG. 9, the substrate 51 forms at least one of the light emitting surfaces of the device.

Figure 10:
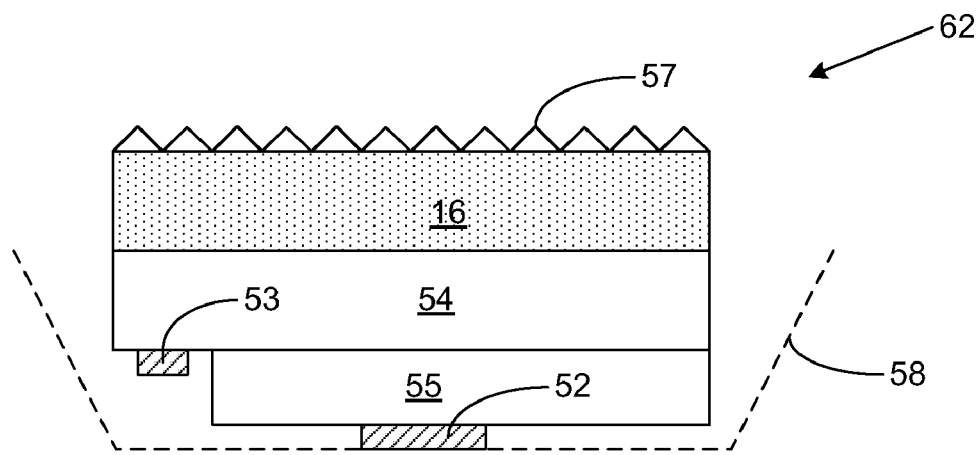
Figure 11:
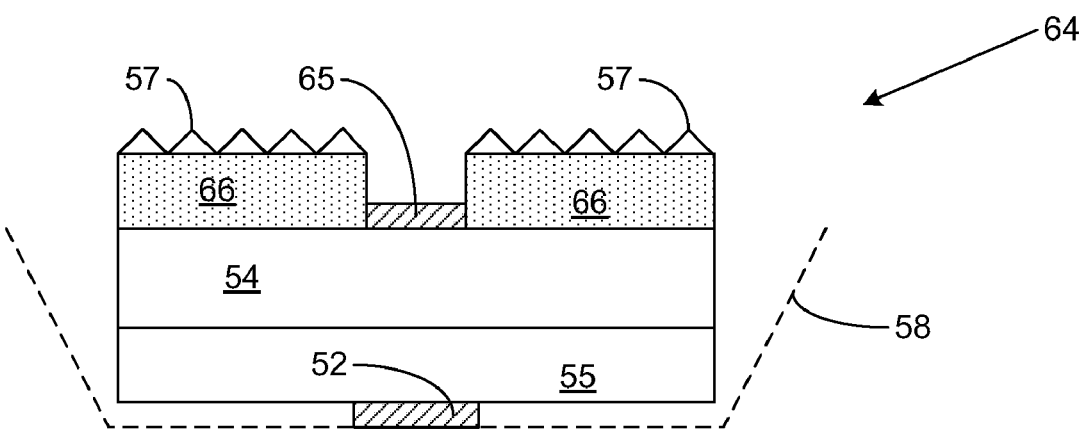
Figure 12:
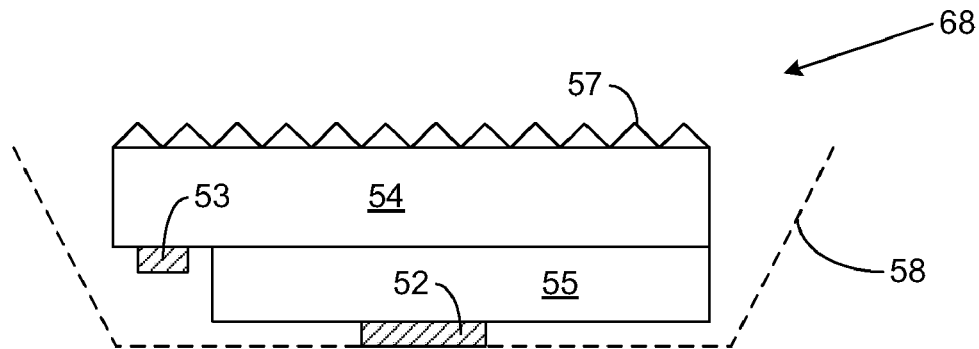

FIGS. 10-12 illustrate embodiments in which the substrate has been removed. The relative position of a lead frame is indicated by the dotted structure 58. Accordingly, FIG. 10 illustrates a diode broadly designated at 62 in a flip chip orientation. The diode 62 includes the undoped layer 16, but without the substrate 51 or the discontinuous layer 56. If the lenticular surface 57 is present, it is present on, or formed from, the undoped layer 16. The n-type and p-type layers are again designated 54 and 55 and the respective ohmic contacts at 52 and 53.

FIG. 11 illustrates a diode broadly designated at 64 in which the substrate has been removed and the ohmic contacts placed in a vertical orientation rather than the horizontal orientation of FIG. 10. In FIG. 11, the ohmic contact 52 carries the same reference numeral as in the previous figures, but the vertically oriented second ohmic contact is designated at 65 to distinguish it from the structure shown in FIGS. 8-10. In this embodiment the undoped portion is divided and labeled at 66. The undoped portion 66 can be opened in any conventional manner to provide the position at which the ohmic contact 65 can be added. The most typical processes include photolithography with appropriate masks, resists, and etches.

As in the other embodiments, the diode 64 can optionally include the lenticular surface 57, with the n-type layer again being designated at 54 and the p-type layer (and any additional active layers) at 55. In FIGS. 10 and 11, the light emission is through the undoped portions 16 and 66 respectively.

FIG. 12 illustrates an embodiment in which both the undoped layer and the substrate have been removed. Accordingly, the diode 68 is formed of the n-type layer 54 and the p-type layer (or additional active players) 55 with the ohmic contacts 52 and 53 being positioned in a horizontal orientation analogous to FIG. 10. The lenticular surface 57 can optionally be included. In FIG. 12, the light emission is from the n-type layer 54.

Figure 13:
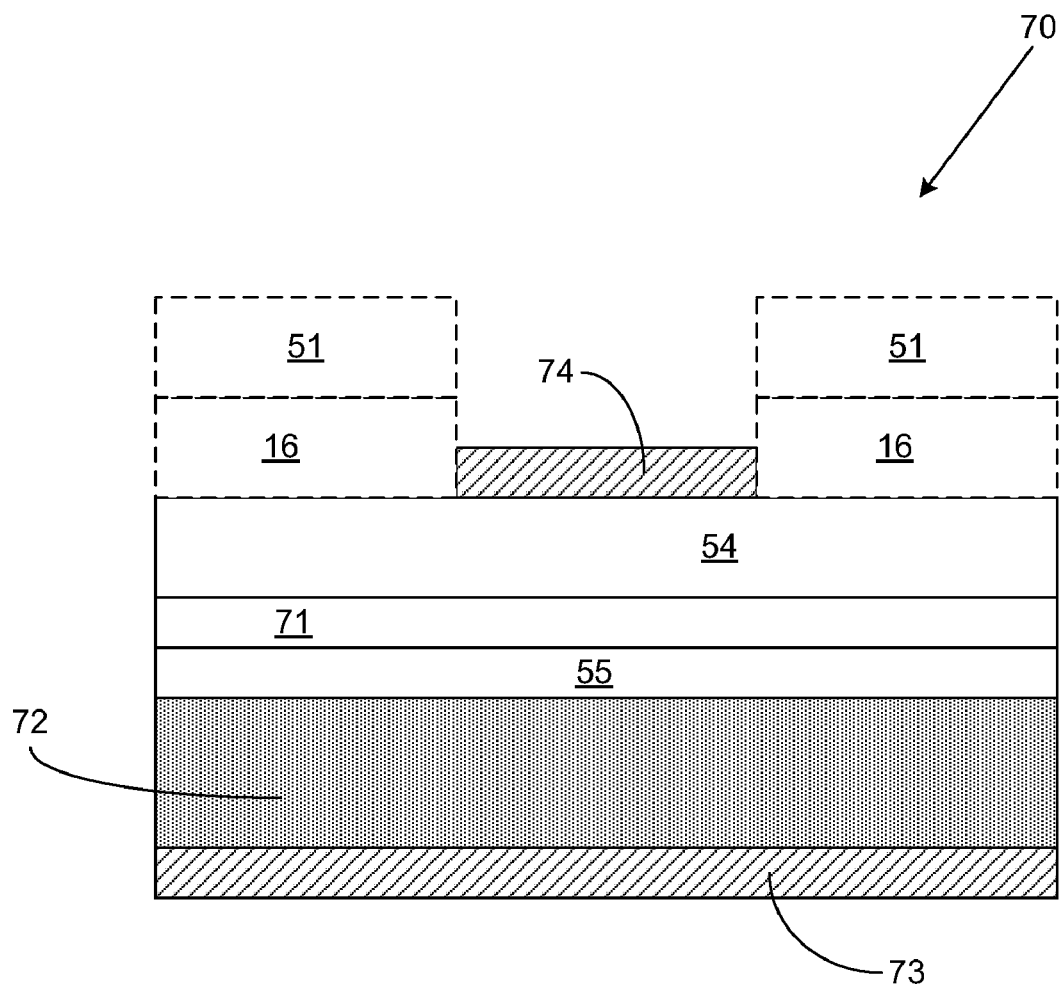

FIG. 13 illustrates an embodiment of a light emitting diode broadly designated at 70. In this embodiment, the substrate 51 and the undoped layer 16 can be either partially or totally removed, an option indicated by the respective dotted rectangles. The n-type layer 54, p-type layer 55 and the (optional) active layer 71 are positioned on a conductive submount structure 72.

In general, the submount structure 72 can be any material that is compatible with the remainder of the diode structure and its eventual operation. In the illustrated embodiment, the submount structure 72 is conductive, and thus will be formed of either a conductively-doped semiconductor material, included silicon carbide, or another conductive material such as a metal. Combinations of one or more materials can also be used to form the submount structure as may be desired or necessary.

In situations where the submount structure need not be conductive, additional materials can be used such as resistive semiconductors, composites, or ceramics.

As generally well understood in the art, the submount structure is typically added to the active portion using an appropriate adhesive material, often accompanied by the application of heat and pressure. In many diode embodiments, a metal or combination of metals will form the adhesive in a manner directly or partially analogous to the use of solder. In other embodiments the nature of the submount material and the adjoining active layer are such that application of pressure or heat or both will create an appropriate physical, and if necessary electrical, bond between the submount and the active portion.

Copending and commonly assigned U.S. Published Applications Nos. 20060063287 and 20060049411 include exemplary (but not limiting) descriptions of submounting structures and techniques, and the contents of each of these is incorporated entirely herein by reference.

In this embodiment, an ohmic contact 73 is on the conductive submount 72 to provide electrical contact to the p-type layer 55 and an n-type ohmic contact 74 is on the n-type epitaxial layer 54. If portions of the undoped layer 16 and the growth substrate 51 remain, they are opened in a normal etching step to provide a window into which the n-type ohmic contact 74 can be positioned.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
    a Group III nitride transition layer having a thickness of between about 0.3 and 1.0 microns and a dopant concentration less than $1E17$ $cm^{-3}$;
    an n-type Group III nitride doped layer directly on said Group III nitride transition layer;
    a first ohmic contact that extends from the n-type Group III nitride doped layer through an opening in the Group III nitride transition layer;
    at least one active layer on said Group III nitride doped layer opposite to the Group III nitride transition layer;
    a p-type Group III nitride layer on said at least one active layer opposite to the Group III nitride doped layer configured to generate light emission when current is applied across said p-type Group III nitride and said n-type Group III nitride doped layer; and
    a second ohmic contact that extends from the p-type Group III nitride layer, wherein the first and second ohmic contacts are used to apply the current across said p-type Group III nitride layer and said n-type Group III nitride doped layer.

2. A light emitting diode according to claim 1 wherein said Group III nitride transition layer comprises aluminum gallium nitride.

3. A light emitting diode according to claim 2 wherein the atomic percentage of aluminum is about 20 percent.

4. A light emitting diode according to claim 1 wherein the at least one active layer comprises an active layer between said p-type layer and said n-type layer.

5. A light emitting diode according to claim 4 comprising ohmic contacts for said p-type layer and said n-type layer for applying a current across said active layer to generate an emission.

6. A display that incorporates the light emitting diode of claim 1.

7. A light emitting diode according to claim 1 comprising respective ohmic contacts for applying a voltage across and generating a current through said p-type and n-type layers.

8. A light emitting diode according to claim 1 wherein the Group III nitride transition layer has a resistivity of at least about 0.1 ohm centimeters.

9. A light emitting diode according to claim 1 wherein the Group III nitride transition layer has a dopant concentration less than 1E17 $cm^{-3}$.

10. A light emitting diode according to claim 9 wherein the dopant concentration of the undoped Group III nitride transition layer is greater than about 1E15 $cm^{-3}$.

11. A light emitting diode according to claim 1 wherein said the undoped Group III nitride transition layer has a lenticular emitting surface.

12. A light emitting diode according to claim 1, wherein said Group III nitride transition layer has a thickness of about 0.3 micron.

13. A light emitting diode according to claim 1, further comprising a discontinuous Group III nitride layer positioned between said Group III nitride transition layer and a substrate selected from the group consisting of silicon carbide and sapphire.

14. A light emitting diode according to claim 1, wherein the header provides electrical connection to the p-type Group III nitride layer and the n-type Group III nitride doped layer.

* * * * *